(12) United States Patent
Zhou

(10) Patent No.: US 11,856,813 B2
(45) Date of Patent: Dec. 26, 2023

(54) DISPLAY PANEL INCLUDING TRANSPARENT CONDUCTIVE MEMBER AND MANUFACTURING METHOD THEREOF

(71) Applicant: Shenzhen China Star Optoelectronics Semiconductor Display Technology Co., Ltd., Shenzhen (CN)

(72) Inventor: Xingyu Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/646,156

(22) PCT Filed: Mar. 2, 2020

(86) PCT No.: PCT/CN2020/077394
§ 371 (c)(1),
(2) Date: Mar. 11, 2020

(87) PCT Pub. No.: WO2021/159566
PCT Pub. Date: Aug. 19, 2021

(65) Prior Publication Data
US 2022/0376212 A1    Nov. 24, 2022

(30) Foreign Application Priority Data

Feb. 10, 2020   (CN) .......................... 202010084042.3

(51) Int. Cl.
*H10K 50/86*   (2023.01)
*H10K 71/00*   (2023.01)
*H10K 102/10*   (2023.01)

(52) U.S. Cl.
CPC .......... *H10K 50/865* (2023.02); *H10K 71/00* (2023.02); *H10K 2102/102* (2023.02); *H10K 2102/103* (2023.02)

(58) Field of Classification Search
None
See application file for complete search history.

(56) References Cited

U.S. PATENT DOCUMENTS

2005/0212447 A1 * 9/2005 Oh ................. H10K 59/173
315/169.3
2007/0069205 A1 * 3/2007 Jinno ................. H01L 27/12
257/E27.111

(Continued)

FOREIGN PATENT DOCUMENTS

CN    107799570 A    3/2018
CN    110518018 A    11/2019

(Continued)

*Primary Examiner* — Nduka E Ojeh
(74) *Attorney, Agent, or Firm* — PV IP PC; Wei Te Chung; Zhigang Ma

(57) ABSTRACT

The present invention provides a display panel and a manufacturing method thereof. The display panel includes a substrate, a light-shielding metal block and a transparent conductive block disposed on the substrate, a buffer layer disposed on the substrate, the light-shielding metal block, and the transparent conductive block, and an active layer pattern disposed on the buffer layer. The active layer pattern comprises a first conductive block, the first conductive block is disposed opposite to the transparent conductive block, the first conductive block is conductively formed by a semiconductor material, and the transparent conductive block and the first conductive block constitute two electrodes of a capacitor.

17 Claims, 3 Drawing Sheets

(56) References Cited

U.S. PATENT DOCUMENTS

| | | | | |
|---|---|---|---|---|
| 2011/0147757 A1* | 6/2011 | Kim | ................... | H01L 27/1255 |
| | | | | 257/E33.001 |
| 2014/0240632 A1* | 8/2014 | Kim | ................... | H01L 27/1288 |
| | | | | 257/59 |
| 2019/0172954 A1 | 6/2019 | Zhou et al. | | |
| 2020/0127141 A1* | 4/2020 | Zhang | ............... | H01L 29/78633 |

FOREIGN PATENT DOCUMENTS

| | | |
|---|---|---|
| CN | 110610964 A | 12/2019 |
| CN | 110943112 A | 3/2020 |
| CN | 110993644 A | 4/2020 |
| JP | 2019135589 A | 8/2019 |

\* cited by examiner

DISPLAY PANEL INCLUDING TRANSPARENT CONDUCTIVE MEMBER AND MANUFACTURING METHOD THEREOF

FIELD OF INVENTION

The present disclosure relates to the field of display technology, and more particularly, to a display panel and a manufacturing method thereof.

BACKGROUND OF INVENTION

Transmittance of display panels plays an extremely important role in their overall display performance. Greater transmittance means greater display brightness of the display panels and better transparency. A structure of the display panels generally includes thin film transistors (TFT) and capacitors. In the prior art, metal layers and ion-doped semiconductor layers are commonly adopted to form two electrodes of capacitors. However, since the metal layer is opaque, a light transmission region of the display panels is reduced, causing transparency of the display panels to be low.

SUMMARY OF INVENTION

The present disclosure provides a display panel, a conducting portion of a source pattern and a transparent conductive block are used to form two electrodes of a capacitor. Since the transparent conductive block and a semiconductor material forming the active layer pattern are both transparent materials, light transmission region of the display panel may be increased, and transparency of the display panel may be improved.

An embodiment of the present disclosure provides a display panel and a manufacturing method thereof to solve a technical problem the display panel has less light transmitting regions and low transparency.

The present disclosure provides a display panel, comprising a substrate, a light-shielding metal block and a transparent conductive block disposed on the substrate, a buffer layer disposed on the substrate, the light-shielding metal block, and the transparent conductive block, and an active layer pattern disposed on the buffer layer, wherein the active layer pattern comprises a first conductive block, the first conductive block is disposed opposite to the transparent conductive block, the first conductive block is conductively formed by a semiconductor material, and the transparent conductive block and the first conductive block constitute two electrodes of a capacitor.

In the display panel provided by the present disclosure, a material of the transparent conductive block is indium tin oxide, zinc alumina oxide, or indium zinc oxide.

In the display panel provided by the present disclosure, the semiconductor material is a transparent metal oxide semiconductor, and the transparent metal oxide semiconductor is indium gallium zinc oxide, indium tin zinc oxide, or indium gallium zinc tin oxide.

In the display panel provided by the present disclosure, the active layer pattern further comprises a second conductive block, a third conductive block, and a conductive channel connecting the second conductive block and the third conductive block, a material of the conductive channel is a semiconductor material, and the second conductive block and the third conductive block are both conductively formed by a semiconductor material.

In the display panel provided by the present disclosure, the conductive channel is disposed right above the light-shielding metal block.

In the display panel provided by the present disclosure, the display panel further comprises an insulating layer pattern and a gate pattern which are disposed on the active layer pattern in a stack, an interlayer medium layer disposed on the buffer layer, the active layer pattern, the insulating layer pattern, and the gate pattern, wherein the interlayer medium layer comprises a first through-hole and a second through-hole, a source pattern and a drain pattern disposed on the interlayer medium layer, wherein the source pattern is connected to the second conductive block through the first through-hole, and the drain pattern is connected to the third conductive block through the second through-hole.

In the display panel provided by the present disclosure, the interlayer medium layer comprises a third through-hole, the third through-hole penetrates through the interlayer medium layer and extends to the light-shielding metal block, wherein the source pattern is connected to the light-shielding metal block through the third through-hole.

In the display panel provided by the present disclosure, a thickness of the active layer pattern ranges from 100 Å to 1000 Å.

In the display panel provided by the present disclosure, a thickness of the transparent conductive block ranges from 200 Å to 2000 Å.

The present disclosure further provides a display panel, comprising a substrate, a light-shielding metal block and a transparent conductive block disposed on the substrate, a buffer layer disposed on the substrate, the light-shielding metal block, and the transparent conductive block, and an active layer pattern disposed on the buffer layer, wherein the active layer pattern comprises a first conductive block, the first conductive block is disposed opposite to the transparent conductive block, the first conductive block is conductively formed by a semiconductor material, and the transparent conductive block and the first conductive block constitute two electrodes of a capacitor. Wherein, a material of the transparent conductive block is indium tin oxide, zinc alumina oxide, or indium zinc oxide, and the semiconductor material is a transparent metal oxide semiconductor, and the transparent metal oxide semiconductor is indium gallium zinc oxide, indium tin zinc oxide, or indium gallium zinc tin oxide.

In the display panel provided by the present disclosure, the active layer pattern further comprises a second conductive block, a third conductive block, and a conductive channel connecting the second conductive block and the third conductive block, a material of the conductive channel is a semiconductor material, and the second conductive block and the third conductive block are both conductively formed by a semiconductor material.

In the display panel provided by the present disclosure, the conductive channel is disposed right above the light-shielding metal block.

In the display panel provided by the present disclosure, the display panel further comprises an insulating layer pattern and a gate pattern which are disposed on the active layer pattern in a stack, an interlayer medium layer disposed on the buffer layer, the active layer pattern, the insulating layer pattern, and the gate pattern, wherein the interlayer medium layer comprises a first through-hole and a second through-hole, a source pattern and a drain pattern disposed on the interlayer medium layer, wherein the source pattern is connected to the second conductive block through the first through-hole, and the drain pattern is connected to the third conductive block through the second through-hole.

In the display panel provided by the present disclosure, the interlayer medium layer comprises a third through-hole, the third through-hole penetrates through the interlayer medium layer and extends to the light-shielding metal block, wherein the source pattern is connected to the light-shielding metal block through the third through-hole.

In the display panel provided by the present disclosure, a thickness of the active layer pattern ranges from 100 Å to 1000 Å.

In the display panel provided by the present disclosure, a thickness of the transparent conductive block ranges from 200 Å to 2000 Å.

The present disclosure relatively provides a manufacturing method of a display panel, comprising providing a substrate; forming a light-shielding metal block and a transparent conductive block on the substrate; forming a buffer layer on the substrate, the light-shielding metal block, and the transparent conductive block; and forming an active layer pattern on the buffer layer, wherein the active layer pattern comprises a first conductive block, the first conductive block is disposed opposite to the transparent conductive block, the first conductive block is formed by conducting a semiconductor material, and the transparent conductive block and the first conductive block constitute two electrodes of a capacitor.

The present disclosure provides a display panel and a manufacturing method thereof. The display panel adopts a conducting portion of an active layer pattern and a transparent conductive block disposed on a substrate to form two electrodes of a capacitor. Since the transparent conductive block and a semiconductor material forming the active layer pattern are both transparent materials, a light transmission region of the display panel is effectively increased, thereby improving transparency of the display panel.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

Figure 1:
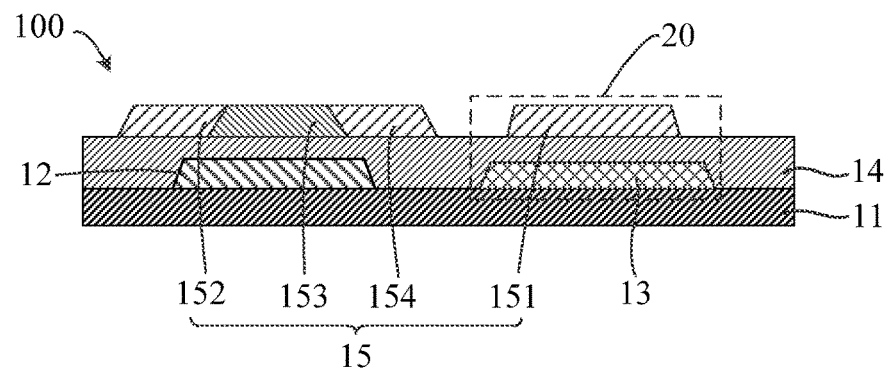
FIG. 1 is a first schematic structure diagram of a display panel provided by an embodiment of the present disclosure.

The technical solutions in the embodiments of the present disclosure will be clearly and completely described below in conjunction with the accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In descriptions of the present disclosure, it should be noted that orientations or position relationships indicated by the terms, such as "thickness", "upper", "lower", "perpendicular", "side", etc. are based on the orientations or position relationships shown in the drawings. These are only convenience for describing the present disclosure and simplifying the descriptions, and does not indicate or imply that the device or element must have a specific orientation, a structure and an operation in the specific orientation, so it cannot be understood as a limitation on the present disclosure. In addition, the terms "first" and "second" are used for describing purposes only, and cannot be understood as indicating or implying relative importance or implicitly indicating the number of technical features indicated. Thus, the features defined as "first" and "second" may explicitly or implicitly include one or more of the features, so it cannot be understood as a limitation on the present disclosure.

In descriptions of the present disclosure, it should be noted that "patterning" refers to steps of forming a patterned structure, it can be a photolithography process, which includes one or more of steps of forming a material layer, coating a photoresist, exposing, developing, etching, and stripping photoresist. This is a process understood by those skilled in the art, and is not described in detail here.

Refer to FIG. 1, the present disclosure provides a display panel 100. The display panel 100 comprises a substrate 11, a light-shielding metal block 12 and a transparent conductive block 13 disposed on the substrate 11, a buffer layer 14 disposed on the substrate 11, the light-shielding metal block 12, and the transparent conductive block 13, and an active layer pattern 15 disposed on the buffer layer 14. The active layer pattern 15 comprises a first conductive block 151, the first conductive block 151 is disposed opposite to the transparent conductive block 13, the first conductive block 151 is formed by conducting a semiconductor material, and the transparent conductive block 13 and the first conductive block 151 constitute two electrodes of a capacitor 20.

Specifically, the substrate 11 may be a glass substrate, a quartz substrate, a resin substrate, a polyimide (PI) flexible substrate, or other types of substrates, which are not described in detail here.

A material of the light-shielding metal block 12 is a metal with excellent conductivity and light-shielding properties, and is generally molybdenum, copper, aluminum, titanium, or a constituent metal, which is not limited in the present disclosure. In a direction perpendicular to the substrate 11, a thickness of the light-shielding metal block 12 ranges from 500 Å to 10000 Å. A material of the transparent conductive block 13 is indium tin oxide (ITO), indium zinc oxide (IZO), zinc aluminum oxide (AZO), or other suitable transparent conductive materials, or a constituent of the above materials. In a direction perpendicular to the substrate 11, a thickness of the transparent conductive block 13 ranges from 200 Å to 2000 Å. A semiconductor material forming the active layer pattern 15 may be a transparent metal oxide semiconductor, and the transparent metal oxide semiconductor is indium gallium zinc oxide (IGZO), indium tin zinc oxide (IZTO), or indium gallium zinc tin oxide (IGZTO). In a direction perpendicular to the substrate 11, a thickness of the active layer pattern 15 ranges from 100 Å to 1000 Å. The buffer layer 14 may be formed of a single layer or multiple layers of silicon dioxide, silicon nitride, or silicon oxynitride. In a direction perpendicular to the substrate 11, a thickness of the buffer layer 14 ranges from 1000 Å to 5000 Å.

It should be noted that the materials and thicknesses of the above film layers can be formed according to actual structural requirements of the display panel 100, and are not specifically limited in the present disclosure.

In addition, compared with the prior art using metal layers and the first conductive block 151 as two electrodes of the capacitor 20, in the embodiment of the present disclosure, the first conductive block 151 and the transparent conductive block 13 are used as two electrodes of the capacitor 20, and a distance between two electrodes of the capacitor 20 is also significantly reduced. It should be understood that the shorter distance between two electrodes of the capacitor 20, the greater storage capacitance per unit area, and the better performance of the capacitor 20. Furthermore, the thickness of the buffer layer 14 can be formed to be similar to the thickness of the transparent conductive block 13, and a distance between the first conductive block 151 and the transparent conductive block 13 can also be effectively reduced; that is, under the premise that the embodiments of the present disclosure are sufficient for structural requirements of the display panel 100 in actual production, the distance between two electrodes of the capacitor 20 can be controlled by controlling the thickness of the transparent conductive block 13 and the buffer layer 14, thereby improving performance of the capacitor 20.

An embodiment of the present disclosure provides a display panel 100. The display panel 100 uses the transparent conductive block 13 disposed on the substrate 11 and the conductive first conductive block 151 included in the active layer pattern 15 as two electrodes of the capacitor 20. Since the transparent conductive block 13 and a semiconductor material forming the first conductive block 151 are both transparent materials, the embodiment of the present disclosure effectively increases light transmission region of the display panel 100 and improves transparency thereof.

It can be understood that, in the embodiment of the present disclosure, the active layer pattern 15 further comprises a second conductive block 152, a third conductive block 154, and a conductive channel 153 connecting the second conductive block 152 and the third conductive block 154. Wherein, a material of the conductive channel 153 is a semiconductor material. The second conductive block 152 and the third conductive block 154 are both formed by conducting a semiconductor material.

Wherein, the conductive channel 153 is disposed right above the light-shielding metal block 12. It should be understood that, after the conductive channel 153 is irradiated with light from one side of the substrate 11, the photo-generated carriers increase, resulting in undesirable phenomena such as threshold voltage drift and increased leakage current of thin film transistors. The light-shielding metal block 12 can prevent light from entering from the substrate 11 away from the light-shielding metal block 12, which reduces interference of external light on the conductive channel 153 and improves stability of a pixel driving circuit in the display panel 100, thereby improving performance of the display panel 100.

Figure 2:
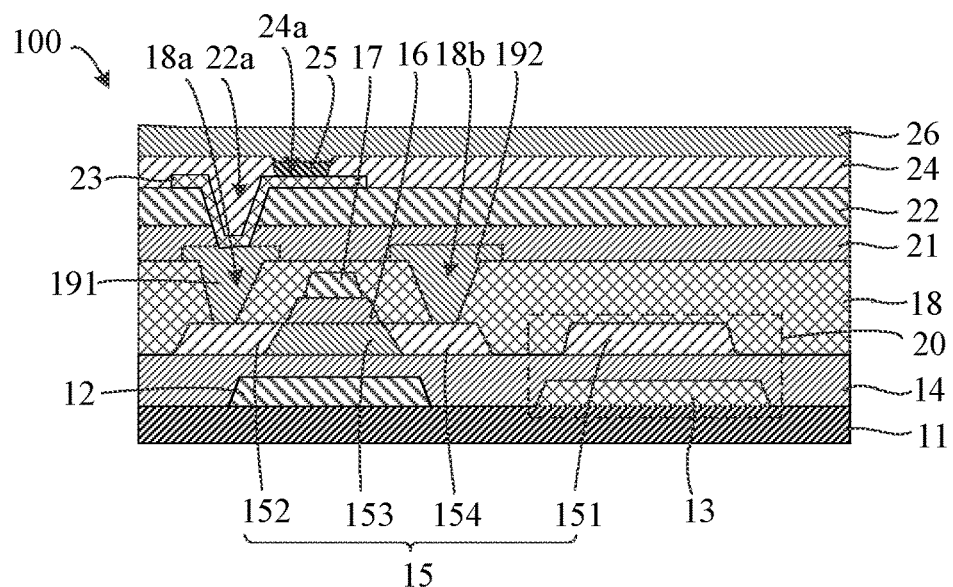
FIG. 2 is a second schematic structural diagram of a display panel provided by the embodiment of the present disclosure.

In the embodiment, referring to FIG. 2, the display panel 100 further comprises an insulating layer pattern 16 and a gate pattern 17 which are disposed on the active layer pattern 15 in a stack; an interlayer medium layer 18 disposed on the buffer layer 14, the active layer pattern 15, the insulating layer pattern 16, and the gate pattern 17, wherein the interlayer medium layer 18 comprises a first through-hole 18a and a second through-hole 18b; and a source pattern 191 and a drain pattern 192 disposed on the interlayer medium layer 18, wherein the source pattern 191 is connected to the second conductive block 152 through the first through-hole 18a, and the drain pattern 192 is connected to the third conductive block 154 through the second through-hole 18b.

Wherein, a material of the insulating layer pattern 16 may be silicon oxide, silicon nitride, or a constitute of silicon oxide and silicon nitride. The insulating layer pattern 16 may be a single-layer structure or a multi-layer structure. In a direction perpendicular to the substrate 11, a thickness of the insulating layer pattern 16 ranges from 1000 Å to 3000 Å. The gate pattern 17 may be a single-layer metal structure or a multi-layer metal laminated structure with good conductivity, and the metal may be molybdenum, copper, aluminum, titanium, or a constitute metal. In a direction perpendicular to the substrate 11, a thickness of the gate pattern 17 ranges from 2000 Å to 8000 Å. A material of the interlayer medium layer 18 may be silicon oxide, silicon nitride, or a constitute of silicon oxide and silicon nitride. The interlayer medium layer 18 may be a single-layer structure or a multi-layer structure. In a direction perpendicular to the substrate 11, a thickness of the interlayer medium layer 18 ranges from 2000 Å to 10000 Å. The source pattern 191 and the drain pattern 192 may be a single-layer metal structure or a multi-layer metal laminated structure with good conductivity, and the metal may be molybdenum, copper, aluminum, titanium, or a constitute metal. In a direction perpendicular to the substrate 11, a thickness of the source pattern 191 and the drain pattern 192 range from 2000 Å to 8000 Å.

Furthermore, the display panel 100 provided by the embodiment of the present disclosure further comprises the interlayer medium layer 18, the source pattern 191, and a passivation layer 21 and a planarization layer 22 on the drain pattern 192. The planarization layer 22 comprises a fourth through-hole 22a. The fourth through-hole penetrates through the planarization layer 22 and extends to the passivation layer 21, and one side of the source pattern 191 away from the substrate 11 is simultaneously exposed. A pixel electrode pattern 23 is disposed on the planarization layer 22, and the pixel electrode pattern 23 is connected to the source pattern 191 through the fourth through-hole 22a. A pixel definition layer 24 is disposed on the planarization layer 22 and the pixel electrode pattern 23, the pixel definition layer 24 comprises a fifth through-hole 24a, and the fifth through-hole 24a exposes one side of the pixel electrode pattern 23 away from the substrate 11. A light-emitting layer 25 is disposed in the fifth through-hole 24a, and one side of the light-emitting layer 25 near the substrate 11 is connected to the pixel electrode pattern 23. A cathode layer 26 is disposed on the pixel definition layer 24 and the light-emitting layer 25, and one side of the light-emitting layer 25 away from the substrate 11 is connected to the cathode layer 26.

Wherein, a material of the passivation layer 21 may be silicon oxide, silicon nitride, or a constitute of silicon oxide and silicon nitride. The passivation layer 21 may be a single-layer structure or a multi-layer structure. In a direction perpendicular to the substrate 11, a thickness of the passivation layer 21 ranges from 1000 Å to 5000 Å. A material of the pixel electrode pattern 23 may be a metal such as indium tin oxide, silver, or indium zinc oxide. The light-emitting layer 25 comprises a light-emitting material capable of emitting red, green, or blue light.

It should be noted that materials and thicknesses of the above functional film layers can be set according to actual structural requirements of the display panel 100, and are not limited in the present disclosure. In addition, the source pattern 191 and the drain pattern 192 are arranged symmetrically, so the source pattern 191 and the drain pattern 192 are interchangeable. The pixel electrode pattern 23 may be connected to either the source pattern 191 or the drain pattern 192. The structure of the display panel 100 shown in FIG. 3 cannot be understood as a limitation on the present disclosure.

Figure 3:
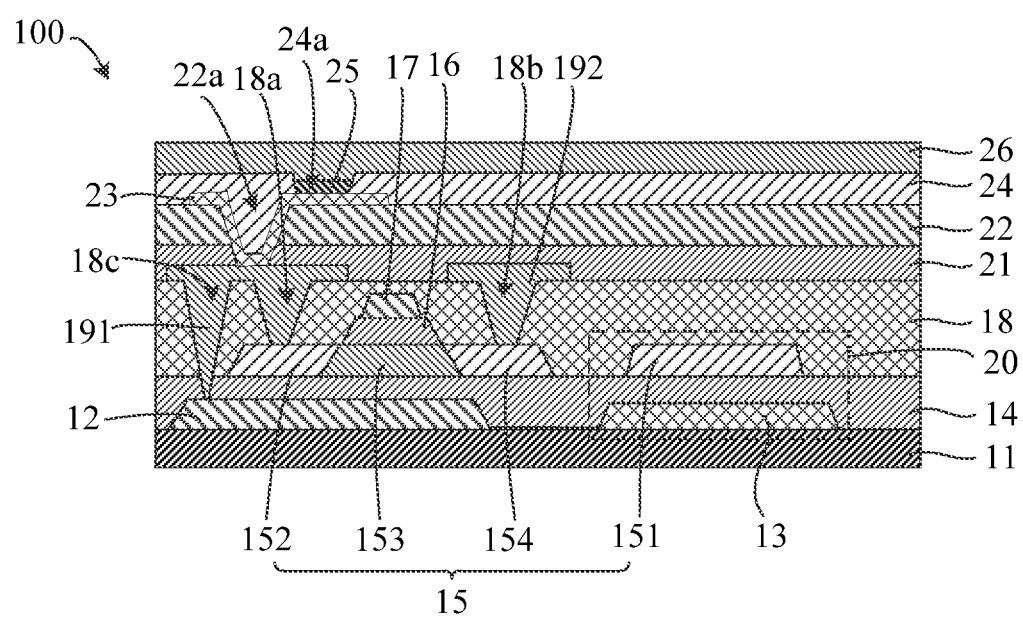
FIG. 3 is a third schematic structural diagram of a display panel provided by the embodiment of the present disclosure.

Refer to FIG. 3, in some embodiments, the interlayer medium layer 18 of the display panel 100 comprises a third through-hole 18c. The third through-hole 18c penetrates through the interlayer medium layer 18 and extends to the buffer layer 14, and one side of light-shielding metal block 12 away from the substrate 11 is simultaneously exposed. Wherein, the source pattern 191 is connected to the light-emitting metal block 12 through the third through-hole 18c. Since the light-shielding metal block 12 and the source pattern 191 are both formed using a highly conductive metal, this setting makes the light-shielding metal block 12 have a light-shielding effect; meanwhile, it can also be used as a portion of the source pattern 191 to enhance conductivity of the source pattern 191, thereby improving performance of thin film transistors in the display panel 100.

Figure 4:
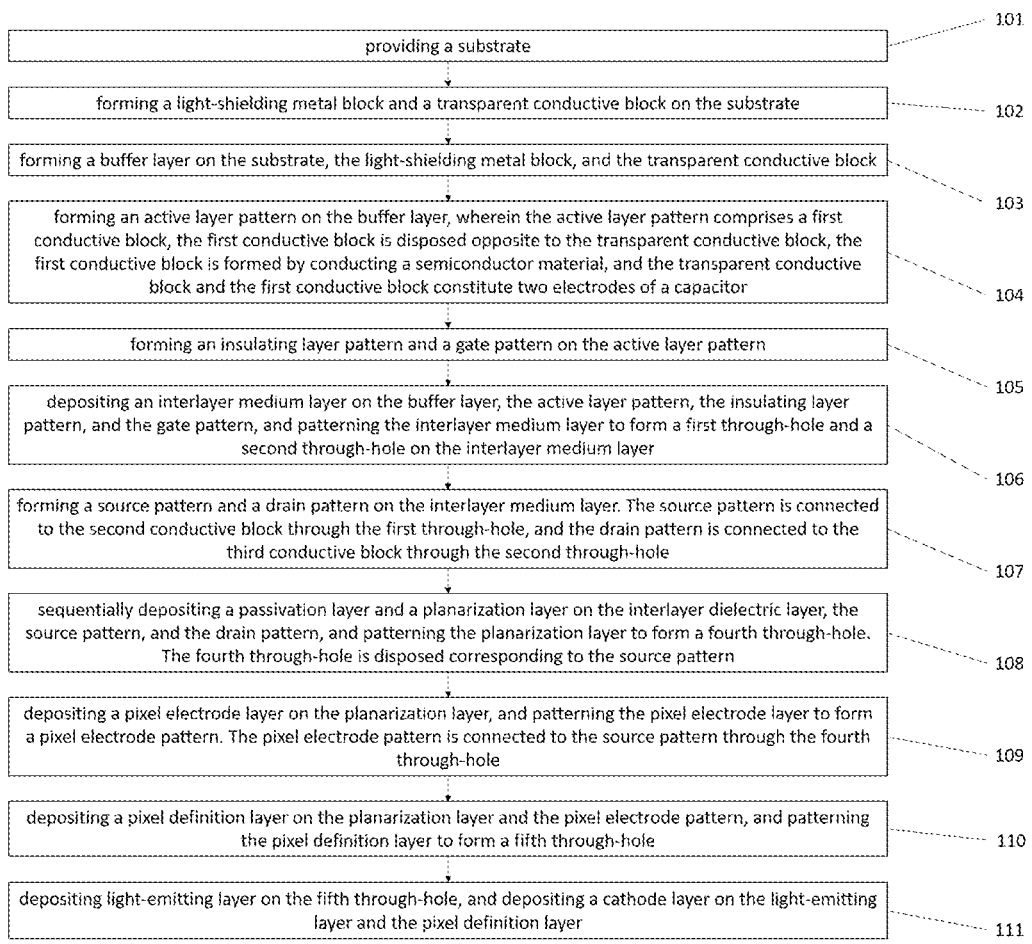
FIG. 4 is a flow chart of a manufacturing method of a display panel provided by an embodiment of the present disclosure.

Refer to FIG. 2 and FIG. 4, the present disclosure further provides a manufacturing method of a display panel 100, which comprises steps as follows:

Step 101: providing a substrate.

Specifically, providing a substrate 11, and cleaning and pre-baking the substrate 11 to remove foreign particles such as oil and grease on a surface of the substrate 11.

Step 102: forming a light-shielding metal block and a transparent conductive block on the substrate.

First, depositing a first metal layer on the substrate 11, and patterning the first metal layer to form the light-shielding metal block 12. Secondly, depositing a transparent conductive layer on a portion of the substrate 11 that is not covered by the light-shielding metal block 12, and patterning the transparent conductive layer to form the transparent conductive block 13.

Step 103: forming a buffer layer on the substrate, the light-shielding metal block, and the transparent conductive block.

Depositing a buffer layer on the substrate 11, the light-shielding metal block 12, and the transparent conductive block 13. Wherein, the buffer layer 14 may be formed by using an evaporation process, a chemical vapor deposition process, a coating process, a sol-gel process, or other processes.

Step 104: forming an active layer pattern on the buffer layer, wherein the active layer pattern comprises a first conductive block, the first conductive block is disposed opposite to the transparent conductive block, the first conductive block is formed by conducting a semiconductor material, and the transparent conductive block and the first conductive block constitute two electrodes of a capacitor.

Depositing a semiconductor layer on the buffer layer 14. The semiconductor layer may be a transparent metal oxide such as indium gallium zinc oxide, indium tin zinc oxide, or indium gallium zinc tin oxide. Patterning the semiconductor layer to form an active layer pattern 15. The active layer pattern 15 comprises a first conductive block 151, a second conductive block 152, a third conductive block 154, and a conductive channel 153 connecting the second conductive block 152 and the third conductive block 154.

Then, conducting the active layer pattern 15 to conduct the first conductive block 151, the second conductive block 152, and the third conductive block 154, which reduces resistance of the first conductive block 151, the second conductive block 152, and the third conductive block 154, thereby improving conductivity thereof. The conductive first conductive block 151 is used as an electrode of a capacitor 20, effectively improving performance of the capacitor 20; meanwhile, the conductive channel 153 is not conductive, maintaining semiconductor characteristics.

Wherein, the first conductive block 151, the second conductive block 152, and the third conductive block 154 can be ion-doped by ion implantation to achieve conductivity. An implanted ion may be a P-type dopant or an N-type dopant, and is not limited in the present disclosure.

An embodiment of the present disclosure provides a manufacturing method of the display panel 100, including forming the transparent conductive block 13 on the substrate 11 as one electrode of the capacitor 20, and conducting the active layer pattern 15 to form the conductive first conductive block 151 as another electrode of the capacitor 20. Since the transparent conductive block 13 and a semiconductor material forming the first conductive block 151 are both transparent materials, the embodiment of the present disclosure effectively increases light transmission region of the display panel 100 and improves transparency thereof.

Furthermore, refer to FIG. 4, the manufacturing method of the display panel 100 further comprises but is not limited to following steps:

Step 105: forming an insulating layer pattern and a gate pattern on the active layer pattern.

Specifically, depositing an insulating layer on the buffer layer 14 and the active layer pattern 15, depositing a second metal layer on the insulating layer, and patterning the second metal layer to form the gate pattern 17. Then, using the gate pattern 17 as a mask, and etching the insulating layer by a self-alignment process to form the insulating layer pattern 16.

It should be noted that, in some embodiments, a process of conducting the active layer pattern 15 in the step 104 can be omitted. After forming the gate pattern 17 and the insulating layer pattern 16, using the gate pattern 17 and the insulating layer pattern 16 as a mask. A plasma implantation process is used to conduct a portion of the active layer pattern 15 that is not covered by the insulating layer pattern 16 and the gate pattern 17 to form the conductive first conductive block 151, the second conductive block 152, the third conductive block 154, and the non-conducting conductive channel 153.

Step 106: depositing an interlayer medium layer on the buffer layer, the active layer pattern, the insulating layer pattern, and the gate pattern, and patterning the interlayer medium layer to form a first through-hole and a second through-hole on the interlayer medium layer.

Specifically, depositing the interlayer medium layer 18 on the buffer layer 14, the active layer pattern 15, the insulating layer pattern 16, and the gate pattern 17. The interlayer medium layer 18 is processed by a yellow photolithography process to form the first through-hole 18a and the second through-hole 18b. The first through-hole 18a is disposed corresponding to the second conductive block 152, and one side of the second conductive block 152 away from the substrate 11 is exposed. The second through-hole 18b is disposed corresponding to the third conductive block 154, and one side of the third conductive block 154 away from the substrate 11 is exposed.

Step 107: forming a source pattern and a drain pattern on the interlayer medium layer. The source pattern is connected to the second conductive block through the first through-hole, and the drain pattern is connected to the third conductive block through the second through-hole.

Specifically, depositing a third metal layer on the interlayer medium layer 18, and patterning the third metal layer to form the source pattern 191 and the drain pattern 192. The source pattern 191 is connected to the second conductive block 152 through the first through-hole 18a, and the drain pattern 192 is connected to the third conductive block 154 through the second through-hole 18b. Since the second conductive block 152 and the third conductive block 154 are both conductive, resistance at contact points between the source pattern 191 and the second conductive block 152, and the drain pattern 192 and the third conductive block 154 is effectively reduced, thereby improving connectivity between the source pattern 191, the drain pattern 192, and the conductive channel 153.

It should be noted that, in some embodiments, in the step 107, the interlayer dielectric layer 18 may be processed by a yellow photolithography process to form the first through-hole 18a, the second through-hole 18b, and the third through-hole 18c. The third through-hole 18c penetrates through the interlayer medium layer 18 and extends to the buffer layer 14, and one side of the light-shielding metal block 12 away from the substrate 11 is simultaneously exposed. Wherein, the source pattern 191 is connected to the light-shielding metal block 12 through the third through-hole 18c. While the light-shielding metal block 12 has a light-shielding effect, it can also be used as a portion of the source pattern 191 to enhance conductivity of the source pattern 191.

Step 108: sequentially depositing a passivation layer and a planarization layer on the interlayer dielectric layer, the source pattern, and the drain pattern, and patterning the planarization layer to form a fourth through-hole. The fourth through-hole is positioned corresponding to the source pattern.

Specifically, sequentially depositing the passivation layer 21 and the planarization layer 22 on the interlayer dielectric layer 18, the source pattern 191, and the drain pattern 192. The planarization layer 22 is processed by a yellow photolithography process to form the fourth through-hole 22a. The fourth through-hole 22a penetrates through the planarization layer 22 and extends to the passivation layer 21, and the one side of the source pattern 191 away from the substrate 11 is simultaneously exposed. Wherein, the passivation layer 21 and the planarization layer 22 may be both formed by using an evaporation process, a chemical vapor deposition process, a coating process, a sol-gel process, or other processes.

Step 109: depositing a pixel electrode layer on the planarization layer, and patterning the pixel electrode layer to form a pixel electrode pattern. The pixel electrode pattern is connected to the source pattern through the fourth through-hole.

Specifically, depositing the pixel electrode layer on the planarization layer 21, and patterning the pixel electrode layer to form the pixel electrode pattern 23. The pixel electrode pattern 23 is connected to the source pattern 191 through the fourth through-hole 22a.

Step 110: depositing a pixel definition layer on the planarization layer and the pixel electrode pattern, and patterning the pixel definition layer to form a fifth through-hole.

Depositing the pixel definition layer 24 on the planarization layer 21 and the pixel electrode pattern 223, and patterning the pixel definition layer 24 to form the fifth through-hole 24a. Wherein, the fifth through-hole 24 exposes one side of the pixel electrode pattern 23 away from the substrate 11.

Step 111: depositing a light-emitting layer on the fifth through-hole, and depositing a cathode layer on the light-emitting layer and the pixel definition layer.

Specifically, forming the light-emitting layer in the fifth through-hole 24a by an inkjet printing process. Then, depositing the cathode layer 26 on the light-emitting layer 25 and the pixel definition layer 24. One side of the light-emitting layer 25 near the substrate 11 is connected to the pixel electrode pattern 23, and another side of the light-emitting layer 25 away from the substrate 11 is connected to the cathode layer.

An embodiment of the present disclosure provides a manufacturing method of the display panel 100, including forming the transparent conductive block 13 on the substrate 11 as one electrode of the capacitor 20, and conducting the active layer pattern 15 to form the conductive first conductive block 151 as another electrode of the capacitor 20. Since the transparent conductive block 13 and a semiconductor material forming the first conductive block 151 are both transparent materials, the embodiment of the present disclosure effectively increases light transmission region of the display panel 100 and improves transparency thereof.

The embodiments of the present disclosure have been described in detail above. The present disclosure uses specific examples to describe principles and embodiments of the present disclosure. The descriptions of the above embodiments are only used to help understand technical solutions of the present disclosure and core ideas thereof. Meanwhile, for those of ordinary skill in the art, according to the ideas of the present disclosure, there will be changes in the specific embodiments and application scope. In summary, contents of this specification should not be construed as a limitation on the present disclosure.

What is claimed is:
1. A display panel, comprising:
a substrate;
a light-shielding metal block and a transparent conductive block disposed on the substrate;
a buffer layer disposed on the substrate, the light-shielding metal block, and the transparent conductive block;
an active layer pattern disposed on the buffer layer, wherein the active layer pattern comprises a first conductive block, the first conductive block is disposed opposite to the transparent conductive block, the first conductive block is conductively formed by a semiconductor material, and the transparent conductive block and the first conductive block constitute two electrodes of a capacitor; and
a pixel electrode disposed on the active layer pattern, wherein an orthographic projection of the pixel electrode on the substrate is spaced apart from an orthographic projection of each of the transparent conductive block and the first conductive block on the substrate.

2. The display panel as claimed in claim 1, wherein a material of the transparent conductive block is indium tin oxide, zinc alumina oxide, or indium zinc oxide.

3. The display panel as claimed in claim 1, wherein the semiconductor material is a transparent metal oxide semiconductor, and the transparent metal oxide semiconductor is indium gallium zinc oxide, indium tin zinc oxide, or indium gallium zinc tin oxide.

4. The display panel as claimed in claim 1, wherein the active layer pattern comprises a second conductive block, a third conductive block, and a conductive channel connecting the second conductive block and the third conductive block, a material of the conductive channel is a semiconductor material, and the second conductive block and the third conductive block are both conductively formed by a semiconductor material.

5. The display panel as claimed in claim 4, wherein the conductive channel is disposed right above the light-shielding metal block.

6. The display panel as claimed in claim 4, wherein the display panel comprises:
   an insulating layer pattern and a gate pattern which are disposed on the active layer pattern in a stack;
   an interlayer medium layer disposed on the buffer layer, the active layer pattern, the insulating layer pattern, and the gate pattern, wherein the interlayer medium layer comprises a first through-hole and a second through-hole; and
   a source pattern and a drain pattern disposed on the interlayer medium layer, wherein the source pattern is connected to the second conductive block through the first through-hole, and the drain pattern is connected to the third conductive block through the second through-hole.

7. The display panel as claimed in claim 6, wherein the interlayer medium layer comprises a third through-hole, and the third through-hole penetrates through the interlayer medium layer and extends to the light-shielding metal block;
   wherein the source pattern is connected to the light-shielding metal block through the third through-hole.

8. The display panel as claimed in claim 1, wherein a thickness of the active layer pattern ranges from 100 Å to 1000 Å.

9. The display panel as claimed in claim 1, wherein a thickness of the transparent conductive block ranges from 200 Å to 2000 Å.

10. A display panel, comprising:
    a substrate;
    a light-shielding metal block and a transparent conductive block disposed on the substrate;
    a buffer layer disposed on the substrate, the light-shielding metal block, and the transparent conductive block;
    an active layer pattern disposed on the buffer layer, wherein the active layer pattern comprises a first conductive block, the first conductive block is disposed opposite to the transparent conductive block, the first conductive block is conductively formed by a semiconductor material, and the transparent conductive block and the first conductive block constitute two electrodes of a capacitor; and
    a pixel electrode disposed on the active layer pattern, wherein an orthographic projection of the pixel electrode on the substrate is spaced apart from an orthographic projection of each of the transparent conductive block and the first conductive block on the substrate,
    wherein a material of the transparent conductive block is indium tin oxide, zinc alumina oxide, or indium zinc oxide, the semiconductor material is a transparent metal oxide semiconductor, and the transparent metal oxide semiconductor is indium gallium zinc oxide, indium tin zinc oxide, or indium gallium zinc tin oxide.

11. The display panel as claimed in claim 10, wherein the active layer pattern comprises a second conductive block, a third conductive block, and a conductive channel connecting the second conductive block and the third conductive block, a material of the conductive channel is a semiconductor material, and the second conductive block and the third conductive block are both conductively formed by a semiconductor material.

12. The display panel as claimed in claim 11, wherein the conductive channel is disposed right above the light-shielding metal block.

13. The display panel as claimed in claim 11, wherein the display panel comprises:
    an insulating layer pattern and a gate pattern which are disposed on the active layer pattern in a stack;
    an interlayer medium layer disposed on the buffer layer, the active layer pattern, the insulating layer pattern, and the gate pattern, wherein the interlayer medium layer comprises a first through-hole and a second through-hole; and
    a source pattern and a drain pattern disposed on the interlayer medium layer, wherein the source pattern is connected to the second conductive block through the first through-hole, and the drain pattern is connected to the third conductive block through the second through-hole.

14. The display panel as claimed in claim 13, wherein the interlayer medium layer comprises a third through-hole, and the third through-hole penetrates through the interlayer medium layer and extends to the light-shielding metal block;
    wherein the source pattern is connected to the light-shielding metal block through the third through-hole.

15. The display panel as claimed in claim 10, wherein a thickness of the active layer pattern ranges from 100 Å to 1000 Å.

16. The display panel as claimed in claim 10, wherein a thickness of the transparent conductive block ranges from 200 Å to 2000 Å.

17. A manufacturing method of a display panel, comprising:
    providing a substrate;
    forming a light-shielding metal block and a transparent conductive block on the substrate;
    forming a buffer layer on the substrate, the light-shielding metal block, and the transparent conductive block;
    forming an active layer pattern on the buffer layer, wherein the active layer pattern comprises a first conductive block, the first conductive block is disposed opposite to the transparent conductive block, the first conductive block is formed by conducting a semiconductor material, and the transparent conductive block and the first conductive block constitute two electrodes of a capacitor; and
    forming a pixel electrode on the active layer pattern, wherein an orthographic projection of the pixel electrode on the substrate is spaced apart from an orthographic projection of each of the transparent conductive block and the first conductive block on the substrate.

* * * * *